United States Patent
Burdick et al.

(10) Patent No.: US 6,661,271 B1
(45) Date of Patent: Dec. 9, 2003

(54) MULTI-PHASE EDGE RATE CONTROL FOR SCSI LVD

(75) Inventors: Brian E. Burdick, Colorado Springs, CO (US); Matthew S. Von Thun, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/158,613

(22) Filed: May 30, 2002

(51) Int. Cl.[7] ............................................. H03H 11/26
(52) U.S. Cl. ...................... 327/269; 327/170; 327/295; 365/233
(58) Field of Search .................. 327/161, 165, 327/166, 261, 269–271, 272, 277, 284, 291, 295, 243; 365/233, 233.5

(56) References Cited

U.S. PATENT DOCUMENTS

| | | | | |
|---|---|---|---|---|
| 4,985,639 A | * | 1/1991 | Renfrow et al. ............ 327/243 |
| 5,566,129 A | * | 10/1996 | Nakashima et al. ..... 365/233.5 |
| 5,694,377 A | * | 12/1997 | Kushnick .................... 368/120 |
| 5,781,055 A | * | 7/1998 | Bhagwan .................... 327/270 |
| 6,324,125 B1 | * | 11/2001 | Frankowsky et al. ....... 368/113 |

OTHER PUBLICATIONS

Edson W. Porter et al., "Programmable Transmit SCSI Equalization", U.S. Ser. No. 09/921,350, Filed Aug. 2, 2001.

* cited by examiner

*Primary Examiner*—Minh Nguyen
(74) *Attorney, Agent, or Firm*—Christopher P. Maiorana, P.C.

(57) ABSTRACT

An apparatus having a plurality of serially cascaded delay cells each configured to generate a phase of a multi-phase signal and an intermediate signal, where (i) each of the delay cells is generally configured to respond to a bias signal and one of the intermediate signals and (ii) a first of the delay cells is generally configured to respond to an input signal.

16 Claims, 5 Drawing Sheets

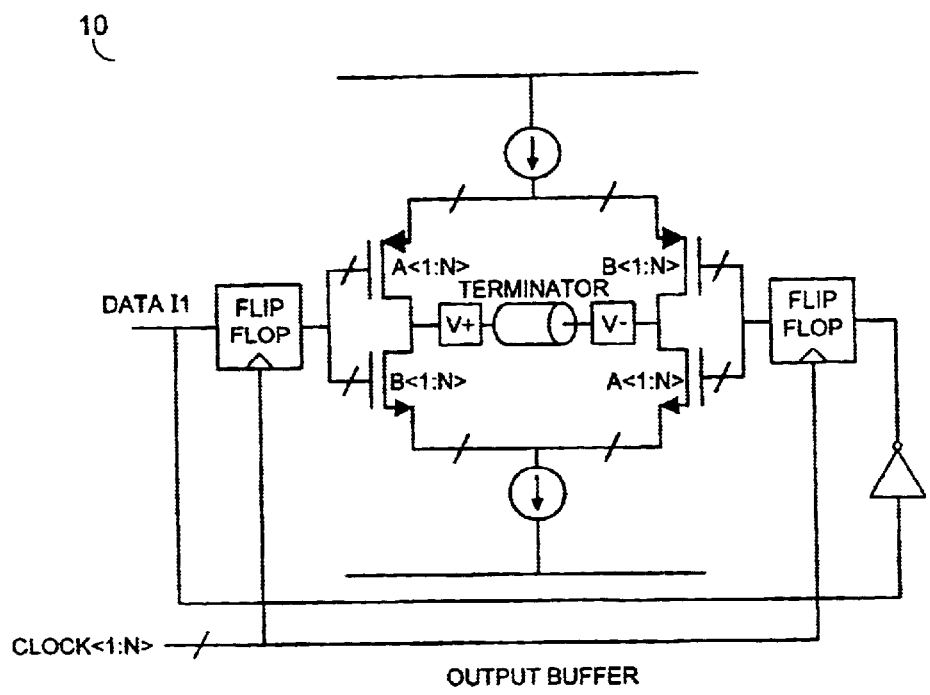
(CONVENTIONAL)
FIG. 1

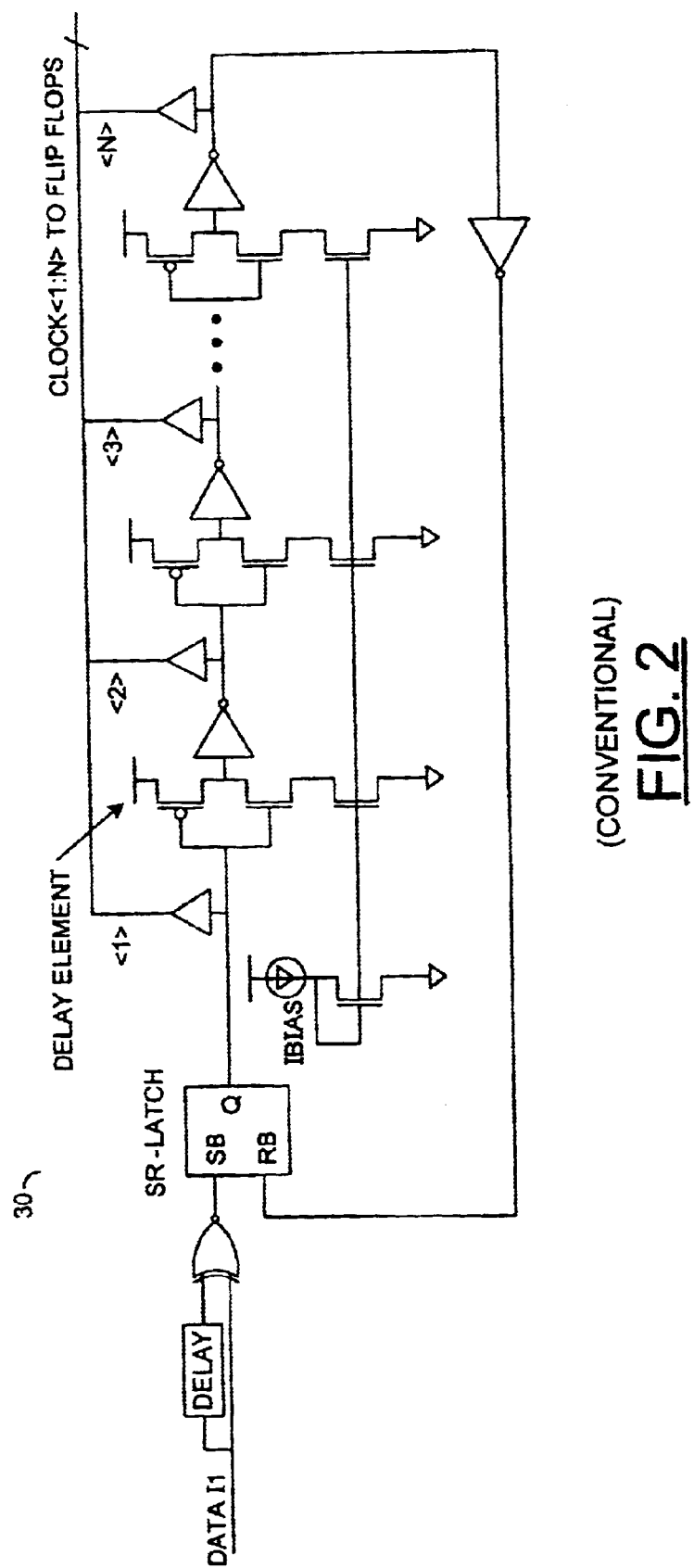
FIG. 2
(CONVENTIONAL)

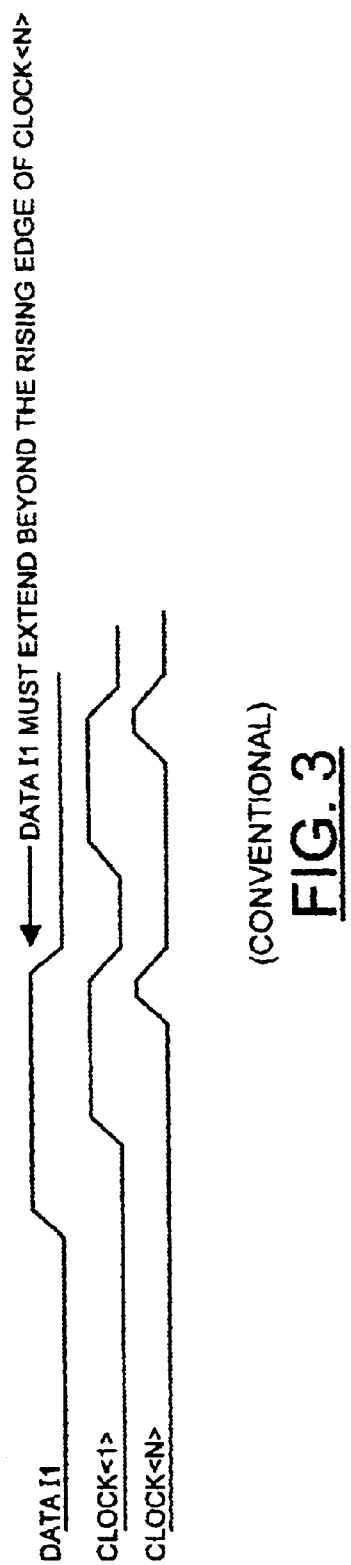
FIG. 3
(CONVENTIONAL)

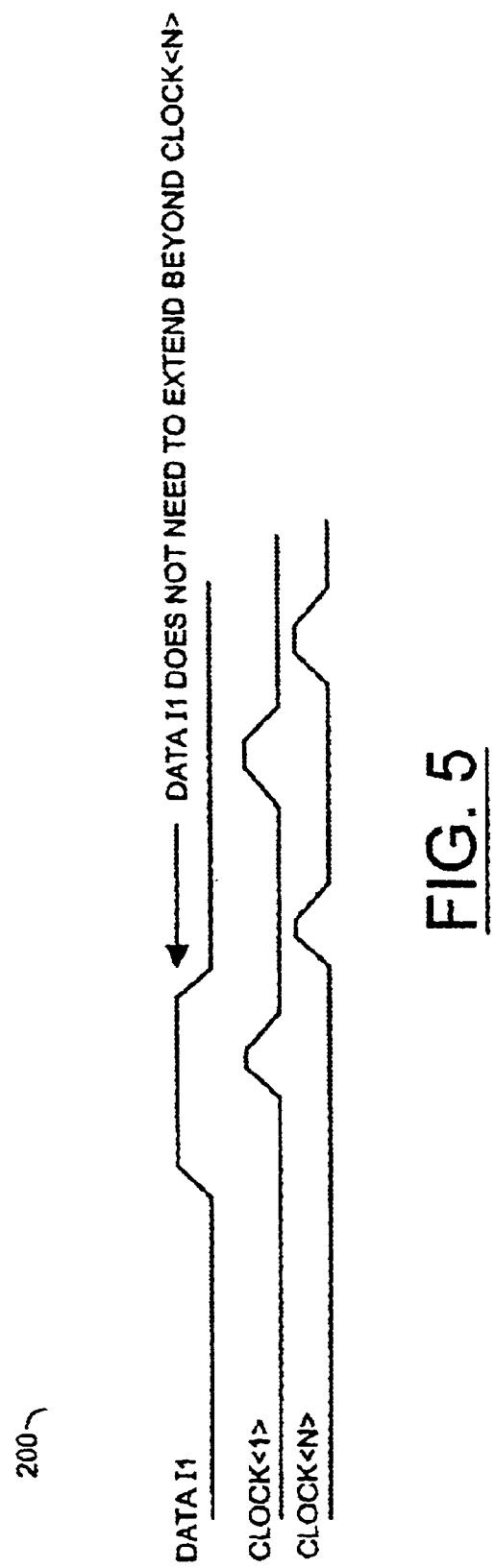

MULTI-PHASE EDGE RATE CONTROL FOR SCSI LVD

CROSS REFERENCE TO RELATED APPLICATIONS

The present application may relate to application Ser. No. 09/921,350, filed Aug. 2, 2001, which is hereby incorporated by reference in its entirety.

FIELD OF THE INVENTION

The present invention relates to edge rate control circuits generally, and, more particularly, to a method and/or apparatus for controlling the edge rate of low voltage differential signals, particularly at high frequencies.

BACKGROUND OF THE INVENTION

Referring to FIG. 1, a circuit 10 is shown implementing a conventional edge rate control circuit. The edge rate control of the circuit 10 is achieved by adding N parallel switches driven by a multi-phase clock through flip flops. The timing between the first and last clock phase determines the edge rates of the transmitted differential waveforms. The flip flops are used to synchronize the timing between V+ and V− and can also be used to synchronize between two or more buffers.

Referring to FIG. 2, a circuit 30 is shown implementing a conventional multi-phase clock generation circuit. A number of clock signals Clock<1> to Clock<N> are shown generated by a number of delay elements. The circuit 30 can be used to generate the clock signals Clock<1> to Clock<N> for the circuit 10. There is a practical limit to the maximum frequency of operation based on the delay time between the clock signals Clock<1> and Clock<N> due to the feedback to the input RB of the SR-latch.

A disadvantage of the circuit 30 is that the feedback to the latch has dependency on each delay element in the delay path. Before the next piece of data in the circuit can be processed, the SR-latch must be reset via the input RB. If the SR-latch is not reset via the input RB then the data can be lost at the output of the buffer across the terminator of the circuit 10 at higher frequencies but the amplitude can be maintained. FIG. 3 shows a timing diagram of the circuit 30 of FIG. 2. The data signal 11 is shown extending beyond the rising edge of the signal Clock<N> for proper operation.

It would be desirable to provide a method and/or architecture that may overcome SCSI cable induced effects by providing a controlled rise time and pre-compensation.

SUMMARY OF THE INVENTION

The present invention concerns an apparatus comprising a plurality of serially cascaded delay cells each configured to generate a phase of a multi-phase signal and an intermediate signal, where (i) each of the delay cells is generally configured to respond to a bias signal and one of the intermediate signals and (ii) a first of the delay cells is generally configured to respond to an input signal.

The objects, features and advantages of the present invention include providing a method and/or architecture for controlling the edge rate of low voltage signals that may (i) overcome SCSI cable induced effects, (ii) provide a controlled rise time and pre-compensation, (iii) increase the maximum operating frequency of a clock signal, (iv) reduce or eliminate delay cell interdependency, and/or (v) optimize driver circuit flip flop performance.

BRIEF DESCRIPTION OF THE DRAWINGS

These and other objects, features and advantages of the present invention will be apparent from the following detailed description and the appended claims and drawings in which:

FIG. 1 is a diagram of a conventional edge rate control circuit;

FIG. 2 is a diagram of a conventional multi-phase clock generator circuit;

FIG. 3 is a timing diagram of the circuit of FIG. 2;

FIG. 5 is a timing diagram of the circuit of FIG. 4.

DETAILED DESCRIPTION OF THE PREFERRED EMBODIMENTS

Figure 4:
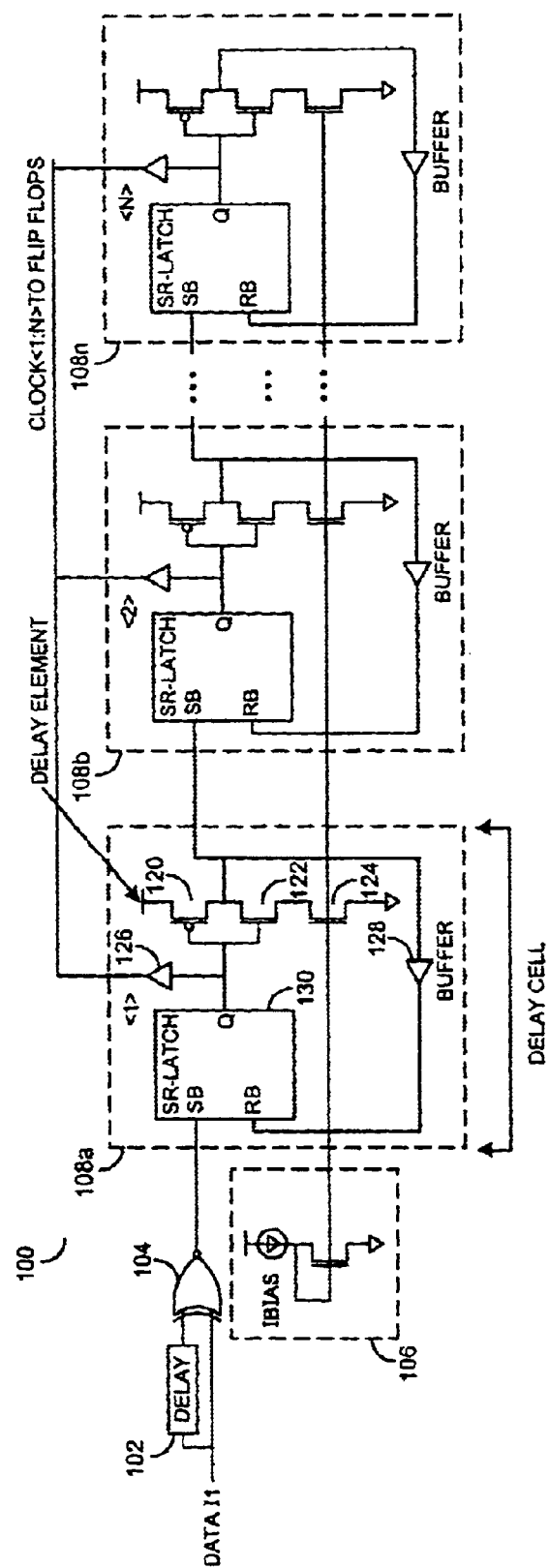
FIG. 4 is a diagram of a preferred embodiment of the present invention.

Referring to FIG. 4, a block diagram of a circuit 100 is shown in accordance with a preferred embodiment of the present invention. The circuit 100 may be implemented as a timing device. The timing circuit 100 may be configured to generate a multi-phase clock signal (e.g., CLOCK<1:N>). The timing circuit 100 may also be configured to control rise time variations. The circuit 100 may generate clock phases in response to an edge transition on an incoming data signal (e.g., DATAI1). The circuit 100 of the present invention may be implemented in connection with driver circuits (not shown). In one example, the circuit 100 may be implemented to provide multi-phase clock signals to one or more small computer systems interface (SCSI) low voltage differential (LVD) drivers. However, the circuit 100 may be advantageously implemented in any appropriate application where a controlled rise time and/or pre-compensation may be desirable.

The circuit 100 generally comprises a delay device 102, a gate 104, a bias circuit 106, and a number of clock phase generation circuits 108a–108n. The clock phase generation circuits may be implemented as delay cells. The particular number of clock phase generation circuits 108a–108n may be varied in order to meet the design criteria of a particular implementation. The gate 104 may be implemented as a XNOR gate. However, other types of gates may be implemented in order to meet the design criteria of a particular implementation. The signal DATAI1 may be presented to the delay device (or circuit) 102 and the gate 104. The gate 104 may also receive an output of the delay circuit 102. The gate 104 may have an output that may present a signal to a data input (e.g., an SB input) of the circuit 108a.

The clock phase generation circuits 108a–108n may be coupled (e.g., cascaded or connected) in a series configuration. The circuits 108a–108n may be implemented as delay cells having substantially equal delay time. The clock phase generation circuits 108a–108n may be configured to generate the signals CLOCK<1:N>, respectively. The signals CLOCK<1:N> are generally combined and may be transmitted as a single multi-phase (e.g., multi-bit) clock signal. The bias circuit 106 may be configured to control the circuits 108a–108n (e.g., the phase of the signals CLOCK<1:N>). The bias circuit 106 may be controlled by a signal (e.g., IBIAS). The signal IBIAS generally controls the amount of delay that each of the circuits 108 generates on the respective signal propagated through the circuits 108.

Each of the clock phase generation circuits (e.g., delay cells) 108a–108n generally comprises a transistor 120, a transistor 122, a transistor 124, a buffer 126, a buffer 128, and a latch 130. The transistor 120 may be implemented as a PMOS transistor and the transistors 122 and 124 may be implemented as NMOS transistors. A first source/drain of the transistor 120 may be coupled to a power supply. A gate of the transistor 120 may be coupled to an output (e.g., Q) of the latch 130. A second source/drain of the transistor 120 may be coupled to a first source/drain of the transistor 122 to present an intermediate output signal to the data (e.g., SB) input of the next stage (e.g., 108b–108n, respectively). A gate of the transistor 122 may be coupled to the output Q of the latch 130, a second source/drain of the transistor 122 may be coupled to a first source/drain of the transistor 124. A gate of the transistor 124 may receive a bias output signal from the bias circuit 106. A second source/drain of the transistor 124 may be coupled to a ground potential. The transistors 120, 122, and 124 generally comprise a delay element. The transistors 120, 122, and 124 are generally serially connected source/drain to source/drain.

The buffer 126 may have an input that may be connected to the output Q of the latch 130 and an output that may present the respective portion of the phased output clock signal (e.g., CLOCK<1:N>, respectively). The buffer 128 may have an input that may be connected to the node formed by the connection of the second source/drain of the transistor 120 and the first source/drain of the transistor 122 and an output that may be coupled to a reset input (e.g., RB) of the latch 130. The buffer 128 may be coupled between the transistors 120 and 122 and the reset input RB and may comprise a feedback path. The connection (or node) of the second source/drain of the transistor 120 and the first source/drain of the transistor 122 may present an intermediate signal to the data input SB of the next clockphase generation circuit 108 (e.g., the delay elements 108b–108n, respectively).

The timing circuit 100 may be implemented to synchronize multiple differential drivers (not shown) with a centralized delay line (e.g., the serially cascaded circuits 108a–108n) to generate the multi-phase clock signal CLOCK<1:N> in response to data edge transitions (e.g., edge transactions of the input signal DATAl1). The multiphase clock signal CLOCK<1:N> may then drive an array of flip-flops (not shown) to generate the differential waveform output on the pins V+ and V− of the differential driver (e.g., a SCSI cable driver). Additionally, the timing circuit 100 may implement a PLL (or DLL) (not shown) to generate the multi-phase clock delay line bias current signal IBIAS. However, other appropriate clock and/or bias signal generation techniques may be implemented to meet the design criteria of a particular application. The timing circuit 100 may be configured to provide edge rate control. The timing circuit 100 may also provide for the precise synchronization of several outputs and for several parallel transmitters (not shown) to be precisely synchronized for multi-level transmit.

Referring to FIG. 5, a timing diagram 200 illustrating an operation of the circuit 100 is shown. A time from a transition of the signal CLOCK<1> to a transition of the signal CLOCK<N> may set the rise and fall times for each differential output stage of a driver circuit and may be controlled by the current source signal IBIAS. For example, in a SCSI driver, the control signal IBIAS may be a process, voltage, and temperature (PVT) compensated source providing 1.5:1 or more delay variation. The signal IBIAS may be programmably (e.g., user) controlled. The PVT compensation may be adjusted with control bits configured to adjust the signal IBIAS to any appropriate level. Additionally, the signal IBIAS may be configured to further track PVT variation by implementing a PLL (or DLL) with a delay in the control loop comprising the delay circuit 102. The signal CLOCK<1> may be delayed with respect to the signal DATAl1 to provide sufficient set-up time on one or more flip-flops that are generally implemented in the driver circuit. However, the signal CLOCK<N> is generally not delayed beyond a hold-time of the flip-flops. Since the circuit 100 of the present invention provides feedback at each delay circuit 108, the pulse width of the signal DATAl1 may not have to extend beyond the pulse width of the respective clock signal pulse CLOCK<N> as in the conventional approach shown in FIG. 3.

The present invention generally provides a method and/or architecture configured to achieve precise edge rate control of a transmitted output waveform. The present invention may provide a new programmable delay circuit that may be configured to control the activation and de-activation of parallel output switches through flip-flops in a manner that allows the edge rate to be adjusted to values equal to half the period of the transmitted frequency. The present invention may also be configured to scale with faster, future frequency requirements.

The circuit 100 may increase the practical limit to the maximum frequency of operation (e.g., the maximum frequency of the signal CLOCK<1:N>) by implementing a SR-latch 130 for each incremental delay cell 108a–108n to generate a traveling pulse (e.g., the intermediate signals presented to the SB input of the latch 130). The maximum clock signal CLOCK<1:N> frequency may theoretically be the delay of one delay cell 108a–108n. In particular, there is generally no dependency from one delay element 108 to the previous and/or next delay element.

In the circuit 100, the pulse width of the clock signals CLOCK<1:N> may be set (e.g., adjusted, controlled, determined, etc.) by the delay element (e.g., the transistors 120, 122 and 124) and the feedback to the latch 130 reset input RB through the buffer 128 in each delay cell 108. When essentially identical delay cells 108a–108n are implemented, then the pulse width of the clock signal CLOCK<1> is essentially the same as the pulse width of the clock signal CLOCK<N>(e.g., the pulse width of the signals CLOCK<1>–CLOCK<N> are substantially equal). The delay may be set for optimum performance with regard to the driver circuit flip flops (not shown). The clock signal CLOCK<1> may process new data (e.g., successive presentations of the signal DATAl1) while the clock signal CLOCK<N> is still processing the old data. Any of the preceding delay circuits 108 may process (e.g., delay and feedback) a respective clock signal independently of the succeeding delay circuit 108. Data is generally maintained at higher frequencies but amplitude may be reduced at the output of the buffer across the terminator at the differential output of the driver circuit. However, the buffer circuits 126 may mitigate output amplitude reduction.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a plurality of serially cascaded delay cells each (i) comprising a latch and (ii) configured to generate a phase of a multi-phase signal and an intermediate signal, wherein (i) each of said delay cells is configured to respond to a bias signal and one of said intermediate signals, (ii) a first of said delay cells is configured to respond to an input signal, (iii) said apparatus further comprises a delay devise and a logic gate configured to receive said input signal and (iv) an output of said logic gate is presented to said first delay cell.

2. The apparatus according to claim 1, wherein each latch comprises (i) a data input configured to receive the intermediate signal of the preceeding delay cell and (ii) a reset input configured to receive the intermediate signal of the delay cell of said latch via a feedback path.

3. The apparatus according to claim 2, wherein each latch further presents an output configured to present a respective portion of said multi-phase signal at said phase.

4. The apparatus according to claim 3, wherein each of said delay cells further comprises a delay element coupled to said latch and configured to generate said intermediate signal.

5. The apparatus according to claim 4, wherein said delay element comprises a PMOS transistor, a first NMOS transistor and a second NMOS transistor connected source/drain to source/drain and (i) a gate of said PMOS transistor and a gate of said first NMOS transistor are configured to receive said portion of said multi-phase signal, (ii) a gate of said second NMOS transistor is configured to receive said bias signal and (iii) a connection of said PMOS transistor and said first NMOS transistor is configured to present said intermediate signal.

6. The apparatus according to claim 3, wherein said portion of said multi-phase signal is presented through a buffer.

7. The apparatus according to claim 3, wherein said respective portions are combined to generate said multi-phase signal configured as a multi-bit signal.

8. The apparatus according to claim 2, wherein said feedback path comprises buffer.

9. The apparatus according to claim 1, wherein said bias signal is programmable.

10. The apparatus according to claim 1, wherein said bias signal is configured to provide process, voltage, and temperature compensation.

11. A method of generating a multi-phase signal comprising the steps of:
(A) serially cascading a plurality of delay cells each (i) comprising a latch and (ii) configured to respond to a bias signal and one of a plurality of intermediate signals, wherein a first of said delay cells is configured to respond to an input signal;
(B) generating one of said intermediate signals and a phase of said multi-phase signal at each respective one of said delay cells;
(C) presenting the intermediate signal of the preceding delay cell to a data input of a latch of the succeeding delay cell; and
(D) presenting the intermediate signal of the delay cell to a reset input of said latch.

12. The method according to claim 11, said method further comprising the step of:
presenting a respective portion of said multi-phase signal at an input of said latch.

13. The method according to claim 11, said method further comprising the step of:
coupling a delay element to said latch; and
generating said intermediate signal via said delay element.

14. The method according to claim 11, wherein said bias signal is programmable to provide process, voltage, and temperature compensation.

15. The method according to claim 11, wherein said method further comprises presenting said multi-phase signal to one or more flip flops of a driver circuit and said multi-phase signal is configured to optimize performance of said flip flops.

16. An apparatus comprising:
a plurality of serially cascaded delay cells each (i) comprising a latch and (ii) configured to generate a phase of a multi-phase signal and an intermediate signal, wherein (i) each of said delay cells is configured to respond to a bias signal and one of said intermediate signals, (ii) a first of said delay cells is configured to respond to an input signal, (iii) each succeeding one of said delay cells is further configured to respond to the intermediate signal presented by a preceeding one of said delay cells and (iv) each latch comprises (a) a data input configured to receive the intermediate signal of the preceeding delay cell and (b) a reset input configured to receive the intermediate signal of the delay cell via a feedback path.

* * * * *